324-77    SR
10/25/83    XR    4,412,348

United States Patent [19]
Sutphin, Jr.

[11]  4,412,348
[45]  Oct. 25, 1983

[54] APPARATUS FOR TESTING LINEARITY OF AN FM TRANSMITTER

[75] Inventor: Eldon M. Sutphin, Jr., Merrimack, N.H.

[73] Assignee: RCA Corporation, New York, N.Y.

[21] Appl. No.: 369,009

[22] Filed: Apr. 16, 1982

[51] Int. Cl.³ .............................................. H04B 17/00
[52] U.S. Cl. .................................. 455/67; 324/77 B; 324/118; 455/115
[58] Field of Search ............... 455/67, 115; 324/77 A, 324/77 B, 78 F, 78 J, 78 Z, 118, 134

[56]  References Cited
U.S. PATENT DOCUMENTS

| | | | |
|---|---|---|---|
| 2,499,755 | 3/1950 | Hunt | 324/78 F |
| 3,379,975 | 4/1968 | Niedereder | 455/115 |
| 3,379,976 | 4/1968 | Niedereder | 455/115 |
| 3,693,076 | 9/1972 | Nugent et al. | 324/77 B |
| 3,736,510 | 5/1973 | Wu | 325/134 |
| 3,992,670 | 11/1976 | Gittins et al. | 325/134 |
| 4,001,695 | 1/1977 | Hrbacek et al. | 325/363 |
| 4,074,191 | 2/1978 | Jules | 324/79 |
| 4,122,391 | 10/1978 | Harp et al. | 324/78 |

OTHER PUBLICATIONS

"Innovations in Microwave Radio Self-Test Systems'-'-Alistair W. Taylor Oct. 5–7, 1981; Int'l Electrical and Electronics Conference and Exposition, Toronto, Canada, Paper No. 81083.

Primary Examiner—Marc E. Bookbinder
Attorney, Agent, or Firm—J. S. Tripoli; R. L. Troike; R. E. Smiley

[57]  ABSTRACT

An FM transmitter linearity test equipment includes an amplitude modulation generator signal source producing an amplitude modulated signal of known varying amplitudes changing at a known rate and a demodulator for demodulating the resulting frequency FM signal from the transmitter. The test equipment also includes a commutating filter operating at said known rate and which is receptive of the demodulated signal for producing a signal of varying amplitude which is compared with the signal produced by the signal source to determine the linearity of the FM transmitter.

4 Claims, 1 Drawing Figure

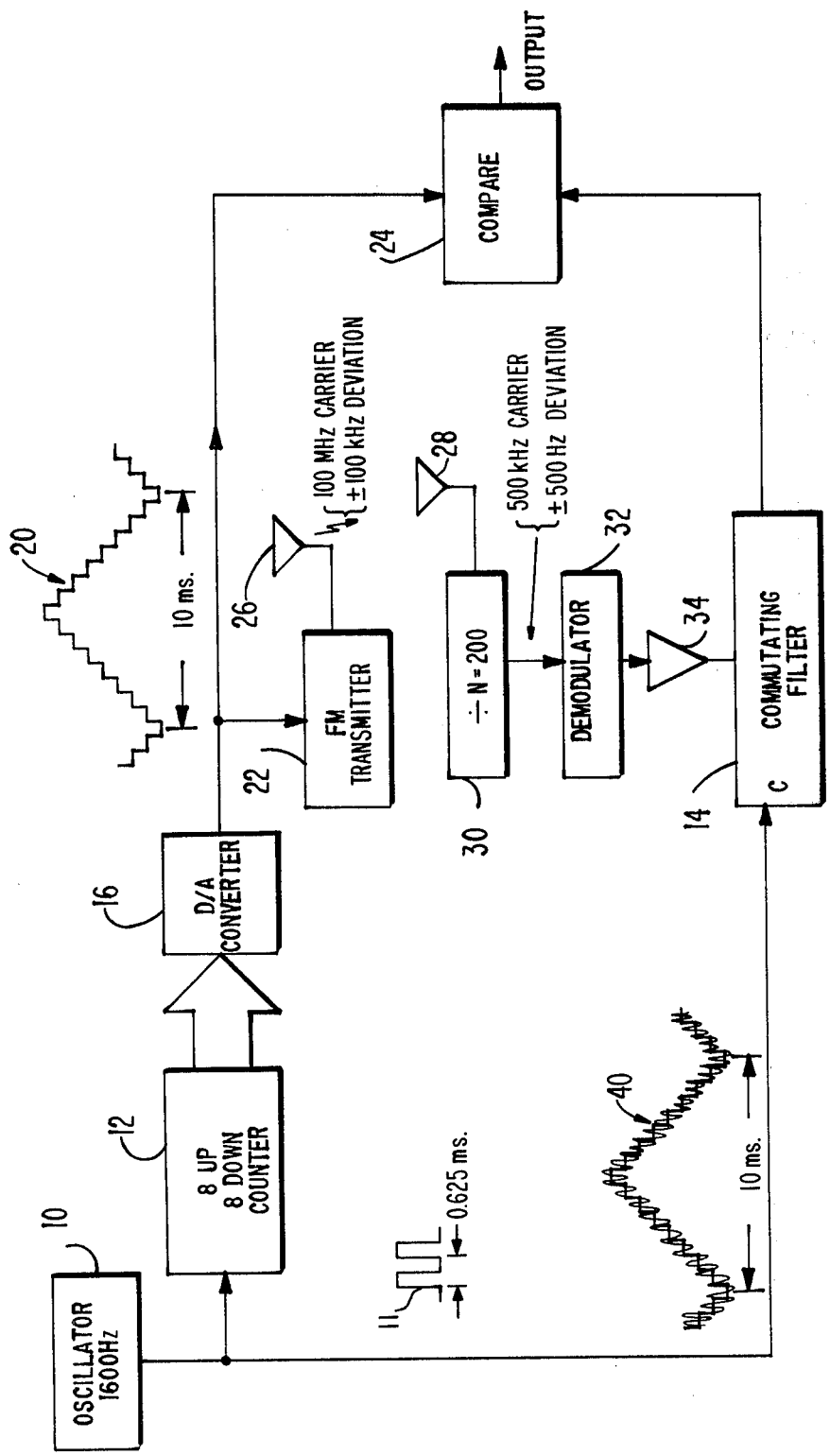

APPARATUS FOR TESTING LINEARITY OF AN FM TRANSMITTER

This invention relates to transmitter test equipment and more particularly to test equipment for testing the linearity of an FM transmitter.

Prior art techniques for checking FM linearity of a frequency modulated (FM) transmitter typically involve modulating at the transmitter a generated carrier signal with a sinusoidal oscillator signal, monitoring the FM output of the transmitter with a receiver which includes a discriminator and which mixes a signal from a local oscillator and the received signal from the transmitter to produce a desirably low intermediate frequency signal at which the discriminator operates. The output of the discriminator is monitored with a distortion analyzer to detect the linearity of the FM transmitter. Such equipment is bulky, comparatively costly and not suitable for use in a field environment.

In accordance with a preferred embodiment of the present invention an apparatus for testing the amplitude vs. frequency linearity of an FM transmitter receptive of varying amplitudes at an input for producing corresponding various frequencies at an output comprises the combination of means for producing an analog signal which varies in amplitude in a known manner at a known rate and includes means for producing a signal indicative of the known rate, means for applying this analog signal to the FM transmitter and means to demodulate the radio-frequency FM signal from the transmitter. The apparatus also includes a commutating filter receptive to the output of the demodulator and which includes a control terminal responsive to the signal at the known rate for controlling the rate at which the commutating filter operates and a comparator receptive to the analog signal and the output of the commutating filter for determining the linearity of the FM transmitter.

In the drawing:

The sole FIGURE is an apparatus for testing the amplitude vs. frequency linearity of an FM transmitter in block diagram form in accordance with a preferred embodiment of the present invention.

In the FIGURE and text it will be understood that the various numbers, frequencies and periods illustrated and mentioned therein are by way of example only. An oscillator 10 which produces control pulses 11 at a known rate such as at a period of 0.625 milliseconds is coupled to a multi-stage binary counter 12 and the control (C) input of a commutating filter 14 to control their operation. The plural outputs of counter 12 are coupled to a digital-to-analog (D/A) converter 16 which produces an analog signal illustrated at waveform 20 as a plot of amplitude vs. time. By way of example, counter 12 counts up to successively higher values upon receipt of each pulse from oscillator 10 through eight counts at which the point the counter begins count down in unit steps upon the receipt of each pulse from oscillator 10. The successive values in counter 12 are converted to an analog signal by converter 16 to produce the signal illustrated at waveform 20, that is, a waveform having eight steps of successively increasing values followed by eight successive steps of decreasing amplitude. The period of waveform 20, with a clock period of 0.625 milliseconds, is 10 milliseconds (equal to 0.625×16).

The output of converter 16 is coupled to an FM transmitter 22 the linearity of which is to be tested and to a comparison apparatus 24. A typical FM transmitter 22 to be tested for linearity is the type which includes an input from a microphone. In that situation the output from converter 16 is simply coupled to the microphone input of transmitter 22. In any event, the amplitude of the signal produced by analog converter 16 is adjusted to fill the range of signal amplitude expected at the input to the transmitter under test.

Transmitter 22 has a conventional antenna 26 used to broadcast signals therefrom into the atmosphere. A typical carrier frequency is 100 megahertz (MHz) and a typical deviation due to waveform 20 is ±100 kilohertz (kHz). The linearity testing apparatus includes some means to receive a signal from transmitter 22. That means may include a receiving antenna 28 as illustrated in the FIGURE or may be a direct connection from the output of transmitter 22. The signal received at antenna 28 or by direct connection is amplified as necessary (by means not shown) and is typically coupled to a frequency divide-by-N circuit 30 where N may be 200, by way of example. The output of divide-by-N circuit 30 is coupled to a demodulator 32. Demodulator 32 may be by way of example a low frequency phase locked loop such as the model CD4046 integrated circuit phase locked loop manufactured by the RCA Corporation, Somerville, New Jersey.

The reason for the divide-by-N circuit 30 is that, typically, the phase locked loop is capable of operating only at a relatively low frequency much below that which would be applied to the phase locked loop in the absence of divide-by-N circuit 30. Using an exemplary carrier frequency of 100 megahertz from transmitter 26, divide-by-N circuit may divide by 200 such that the carrier frequency of the signal applied to demodulator 32 is 500 kilohertz (equals 100 megahertz divide by 200). Similarly, assuming that the amplitude of the modulation signal waveform 20 results in a signal modulation frequency having an excursion of ±100 kilohertz, the excursion of the 500 kilohertz out of divide-by-N circuit 30 is ±500 hertz. The output of demodulator 32 is coupled to a suitable signal gain amplifier 34. The output of amplifier 34 is coupled to the signal input of commutating filter 14.

Commutating filter 14 may typically be of a design similar to that illustrated and described in an article entitled "WANT A BAND PASS FILTER?" by Bud Broeker, *Electronic Design* 22, Oct. 25, 1970, pages 76-78, except that in place of the eight section filter as shown in the article, a sixteen section filter would be provided if the type of counter 12, which has been described, is utilized.

As described in the Broeker article, a commutating filter is essentially a series of identical RC filters which are activated in sequence by a control pulse applied to a control terminal of the commutating filter. The control pulses operate an N stage counter. The counter in sequence closes N switches to couple, sequentially, the input signal, such as from amplifier 34, to N successive RC filters. The purpose of commutating filter 14 is as described below.

Using the above-mentioned figures a typical output from demodulator 32 for a 500 kilohertz carrier signal is 2.5 volts with a peak-to-peak AC signal corresponding to the ±500 hertz deviation of 5 millivolts. At 5 millivolts the signal is very noisy as illustrated in waveform 40 which is exemplary of the output from demodulator 32. The noisy signal 40 is processed by commutating filter 14 to remove the noise. The commutating filter is driven at the same rate as the step change of amplitude from converter 16 and therefore at the rate at which the modulating frequency changes and the rate at which the signal produced by transmitter 22 changes. Therefore, a very high Q commutating filter 14 may be used which easily removes the noise.

The output of the commutating filter 14 is connected to comparison circuit 24. The comparing device 24 may be an automatic comparing device or may be an oscilloscope in which the two signals are presented on two separate traces. Alternatively, since the input signal produced by converter 16 is known a priori the resulting output signal from commutating filter 14 may simply be measured by some means to determine its step sizes and these may be compared with the known input signal to transmitter 22 to determine the degree of linearity. Comparing device 24 may also be a fast fourier transform analyzer or other spectrum analyzer for performing comparison in the frequency domain rather than the time domain.

Operation of the linearity tester is as follows. The output of digital-to-analog converter 16 is coupled to the signal input of the FM transmitter 22 under test and typically this is to the microphone input of the transmitter. Depending on the type of interconnection between the output of the transmitter and the test apparatus an interconnection is made between the output and divide-by-N circuit 30. Next, oscillator 10 is operated to produce periodic pulses at a known rate. These periodic pulses drive up/down counter 12 to produce a given output signal from converter 16 as illustrated by waveform 20 which is applied to transmitter 22 to modulate the output carrier signal therefrom. The resulting modulated signal is received at divide-by-N circuit 30 which divides the signal down to a frequency which is within the range of frequencies that can be handled by the type of demodulator 32 chosen for the test apparatus. The reduced frequency signal is applied to demodulator 32 which produces at its filter output a signal as illustrated in waveform 40, that is, the signal being amplitude modulated about a DC level corresponding to the carrier frequency and having noise riding on the amplitude modulated signal. The signal is next passed to commutating filter 14 which is commutated at the same rate as the steps in modulating signal waveform 20 by pulse source 10. The resulting commutating filter has a very high Q and thus eliminates the noise from waveform 40 to produce a waveform similar to waveform 20 and ideally identical to waveform 20 if the transmitter is completely linear. Any deviation from linearity is determined by comparing means 24 which is previously described may be an automatic comparison device or simply a means enabling a manual comparison by an operator.

It will be understood that the particular shape of modulating signal as illustrated in waveform 20 is arbitrary although the sinusoidal approximating signal as shown is perhaps as goos as any that might be utilized. Any desired shape of signal may be utilized so long as the signal as a function of time is known so that a comparison may take place. Thus, for example, it may be possible to use a sawtooth shape by simply having a counter 12 which steps up in some predetermined number of counts and then resets to its initial count and recycles in that manner. Further, the particular number of steps shown, 16, is purely arbitrary and will be determined by the degree of linearity desired to be tested. The divide-by-N circuit 30 may not be necessary if the frequencies are such that demodulator 32 can operate directly on received frequencies from transmitter 22. Such will be the case if the demodulator can either handle a relatively high carrier frequency or if the carrier frequency from transmitter 22 is relativey low.

What is claimed is:

1. Apparatus for testing the amplitude vs. frequency linearity of an FM transmitter receptive of varying amplitudes at an input for producing corresponding various modulation frequencies at an output comprising, in combination:

means for producing an analog signal which varies in amplitude in a known manner at a known rate and including means for producing a signal indicative of said rate;

means for applying the analog signal to said transmitter to be tested for causing said transmitter to produce a radio frequency FM signal modulated in accordance with the analog signal provided thereto;

means to demodulate the said radio frequency FM signal from said transmitter to produce an analog signal corresponding to the modulation frequency of said transmitter;

a commutating filter receptive to the output of said demodulator and including a control terminal responsive to said signal at said known rate for controlling the rate at which said commutation filter operates; and a comparator receptive to said analog signal and the output of said commutating filter.

2. The combination as set forth in claim 1 wherein said means for producing said analog signal comprises an oscillator and an up-down staircase wave generator controlled by said oscillator and having an output coupled to the modulating signal input of said FM transmitter.

3. The combination as set forth in claim 2 wherein said up-down staircase waveform generator comprises an up-down counter coupled to receive signals from said oscillator and a digital-to-analog converter coupled to receive signals from said counter and to produce a signal having an amplitude which is of a function of the value of the count in said counter.

4. The combination as set forth in claim 1 wherein said means to demodulate said radio-frequency FM signal comprises a frequency divider and a low-frequency phase-locked loop demodulator coupled to receive the signals from said frequency divider.

* * * * *